United States Patent
Lu et al.

(10) Patent No.: US 12,146,798 B2
(45) Date of Patent: Nov. 19, 2024

(54) THIN FILM TRANSISTOR BASED TEMPERATURE SENSOR

(71) Applicant: TAIWAN SEMICONDUCTOR MANUFACTURING CO., LTD., Hsinchu (TW)

(72) Inventors: Shih-Lien Linus Lu, Hsinchu (TW); Katherine H. Chiang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 596 days.

(21) Appl. No.: 17/461,202

(22) Filed: Aug. 30, 2021

(65) Prior Publication Data

US 2023/0061108 A1    Mar. 2, 2023

(51) Int. Cl.
| | |
|---|---|
| G01K 7/02 | (2021.01) |
| G01K 7/32 | (2006.01) |
| H01L 27/092 | (2006.01) |
| H01L 27/12 | (2006.01) |
| H03K 3/03 | (2006.01) |
| H01L 27/118 | (2006.01) |
| H03K 3/011 | (2006.01) |

(52) U.S. Cl.
CPC .............. *G01K 7/021* (2013.01); *G01K 7/32* (2013.01); *H01L 27/092* (2013.01); *H01L 27/1203* (2013.01); *H01L 27/1225* (2013.01); *H03K 3/0315* (2013.01); *H01L 27/11803* (2013.01); *H03K 3/011* (2013.01)

(58) Field of Classification Search
CPC ........ G01K 7/021; G01K 7/32; H01L 27/092; H01L 27/1203; H01L 27/1225; H01L 27/11803; H03K 3/0315
See application file for complete search history.

(56) References Cited

U.S. PATENT DOCUMENTS

| | | | | |
|---|---|---|---|---|
| 5,895,629 | A * | 4/1999 | Russell .............. | G01N 25/4846 374/E7.003 |
| 6,278,132 | B1 * | 8/2001 | Yamazaki ......... | H01L 29/78696 257/E27.111 |
| 6,841,401 | B1 * | 1/2005 | Nishimoto ............. | G01D 3/022 73/1.01 |
| 7,791,424 | B2 * | 9/2010 | Sutardja .................. | H01L 23/34 331/158 |
| 7,831,873 | B1 * | 11/2010 | Trimberger ............ | G01K 3/005 327/512 |

(Continued)

*Primary Examiner* — Nathaniel T Woodward
*Assistant Examiner* — Philip L Cotey
(74) *Attorney, Agent, or Firm* — Sterne, Kessler, Goldstein & Fox P.L.L.C.

(57) ABSTRACT

The present disclosure describes an embodiment of a thin film transistor based temperature sensor circuit. The thin film transistor based temperature sensor circuit includes a first frequency generator with thin film transistors, a second frequency generator with complementary metal oxide semiconductor transistors, first and second counter devices, and a processor device. The first and second counter devices are configured to count a number of first pulses and a number of second pulses from the first frequency generator and second frequency generator, respectively. The processor device is configured to determine a frequency based on the number of first and second pulses.

20 Claims, 14 Drawing Sheets

(56) References Cited

U.S. PATENT DOCUMENTS

| | | | | |
|---|---|---|---|---|
| 8,120,434 | B2* | 2/2012 | Rantala | G01N 29/2437 |
| | | | | 331/57 |
| 8,960,004 | B2* | 2/2015 | Zaghloul | G01N 29/036 |
| | | | | 73/579 |
| 9,695,036 | B1* | 7/2017 | Berger | H03H 9/2457 |
| 10,676,349 | B1* | 6/2020 | Grosjean | H03H 9/02 |
| 11,018,654 | B1* | 5/2021 | Luo | G01K 7/00 |
| 11,584,642 | B1* | 2/2023 | Grosjean | H10N 39/00 |
| 2007/0063775 | A1* | 3/2007 | Frank | H03B 21/01 |
| | | | | 331/2 |
| 2008/0303037 | A1* | 12/2008 | Irving | H01L 29/7869 |
| | | | | 438/22 |
| 2009/0096495 | A1* | 4/2009 | Keigo | G01K 7/01 |
| | | | | 327/512 |
| 2009/0134947 | A1* | 5/2009 | Tarng | H03B 5/04 |
| | | | | 331/116 FE |
| 2010/0001740 | A1* | 1/2010 | Rantala | G01N 29/028 |
| | | | | 324/600 |
| 2012/0043999 | A1* | 2/2012 | Quevy | H03L 7/18 |
| | | | | 327/147 |
| 2015/0192487 | A1* | 7/2015 | Belov | G01L 19/0092 |
| | | | | 73/754 |
| 2018/0076816 | A1* | 3/2018 | Matsuzaki | G01K 7/32 |
| 2018/0293937 | A1* | 10/2018 | Tong | G01K 7/015 |
| 2019/0199329 | A1* | 6/2019 | Shor | H03M 1/1061 |
| 2019/0212300 | A1* | 7/2019 | Cole | G01N 29/022 |
| 2019/0317547 | A1* | 10/2019 | Savoj | G01K 7/01 |
| 2019/0363213 | A1* | 11/2019 | Lo | H01L 31/102 |
| 2020/0313664 | A1* | 10/2020 | Azam | H03K 7/08 |
| 2020/0333393 | A1* | 10/2020 | Fayneh | G01K 7/00 |
| 2021/0003534 | A1* | 1/2021 | Lal | G06F 3/0416 |
| 2022/0163408 | A1* | 5/2022 | Binet | G01K 15/005 |
| 2022/0166379 | A1* | 5/2022 | Itomi | H03H 9/1014 |

* cited by examiner

THIN FILM TRANSISTOR BASED TEMPERATURE SENSOR

BACKGROUND

The semiconductor integrated circuit industry has experienced exponential growth. Technological advances in integrated circuit materials and design have produced generations of integrated circuits where each generation has smaller and more complex circuits than the previous generation. During the course of the integrated circuit evolution, functional density (e.g., the number of interconnected devices per chip area) has generally increased while integrated circuit component geometry size (e.g., the smallest component or line that can be created using a fabrication process) has decreased, thus increasing the need for thermal management of the integrated circuit.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

Illustrative embodiments of the present disclosure will now be described with reference to the accompanying drawings. In the drawings, like reference numerals generally indicate identical, functionally similar, and/or structurally similar elements.

DETAILED DESCRIPTION

Figure 1:
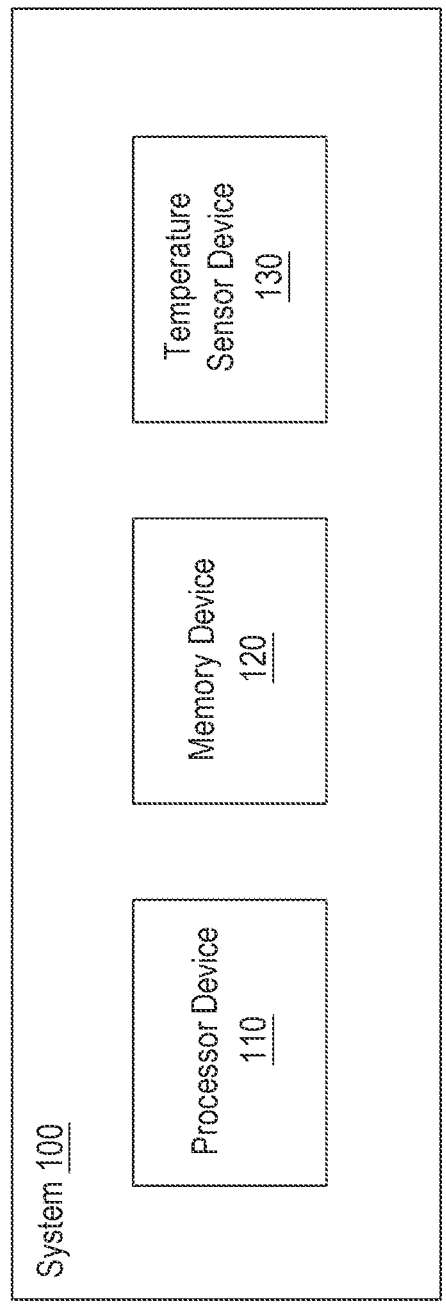
FIG. 1 is an illustration of a system with a temperature sensor device, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments of the present disclosure and/or configurations discussed.

In some embodiments of the present disclosure, the terms "substantially" and "about" can indicate a value of a given quantity that varies within 5% of the value (e.g., ±1%, ±2%, ±3%, ±4%, ±5% of the value). These values are merely examples and are not intended to be limiting. The terms "substantially" and "about" can refer to a percentage of the values as interpreted by those skilled in relevant art in light of the disclosure herein.

The following disclosure describes aspects of a thin film transistor based temperature sensor device. The thin film transistor based temperature sensor device includes a first frequency generator with thin film transistors, a second frequency generator with complementary metal oxide semiconductor transistors, first and second counter devices, and a processor device. The first and second counter devices are configured to count a number of first pulses and a number of second pulses from the first and second frequency generators, respectively. The processor device is configured to determine a temperature, such as a temperature of a system implementing the thin film transistor based temperature sensor device, based on the number of first and second pulses. Benefits of the thin film transistor based temperature sensor device, among others, include low power consumption, a compact circuit design, and independence from temperature variation.

FIG. 1 is an illustration of a system 100 with a temperature sensor device 130, according to some embodiments of the present disclosure. In addition to temperature sensor device 130, system 100 includes a processor device 110 and a memory device 120. Though system 100 includes processor device 110, memory device 120, and temperature sensor device 130, based on the description herein, system 100 can include other elements-such as an input/output circuit, an interconnect bus controller, and other analog/digital circuits-which are within the spirit and scope of the present disclosure.

In some embodiments of the present disclosure, processor device 110 can be a central processing unit, a graphics processing unit, or a combination thereof. Processor device 110 can be other types of processing devices, such as a network processing device, a sound processing device, and an application-specific integrated circuit. These other types of processing devices are within the spirit and scope of the present disclosure. In some embodiments of the present disclosure, memory device 120 can be any type of memory, such as a static random access memory device, a dynamic random access memory device, a synchronous dynamic random access memory device, a flash memory device, a magneto-resistive random access memory device, a phasechange random access memory device, and a ferroelectric random access memory device. Processor device 110 can perform one or more functions in system 100, such as execution of a program and application. Memory device 120 can be used to store the program and application, as well as store data used by the program and application to be accessed by processor device 110.

Temperature sensor device 130 is configured to detect temperature in system 100, according to some embodiments of the present disclosure. For example, system 100 can be included in an integrated circuit chip package or a device casing. During operation, system 100 can generate heat due to, for example, the performance of logic functions and/or signal transmission. As a result, heat from system 100 may dissipate into the integrated circuit chip package or the device casing, thus creating thermal energy in an enclosed environment. Excessive thermal energy in the enclosed environment can hinder the performance of system 100 or make system 100 non-functional altogether. Temperature sensor device 130 can be used to detect and monitor the temperature in the integrated circuit chip package or the device casing. Based on the description herein, system 100 can be enclosed in other types of packages or enclosures, which are within the spirit and scope of the present disclosure.

Temperature sensor device 130 can be a separate element from processor device 110 and memory device 120 as shown in FIG. 1, according to some embodiments of the present disclosure. In some embodiments of the present disclosure, temperature sensor device 130 can be integrated into processor device 110, memory device 120, or any other element not shown in system 100 (e.g., an input/output circuit, an interconnect bus controller, and other analog/digital circuits).

Figure 2:
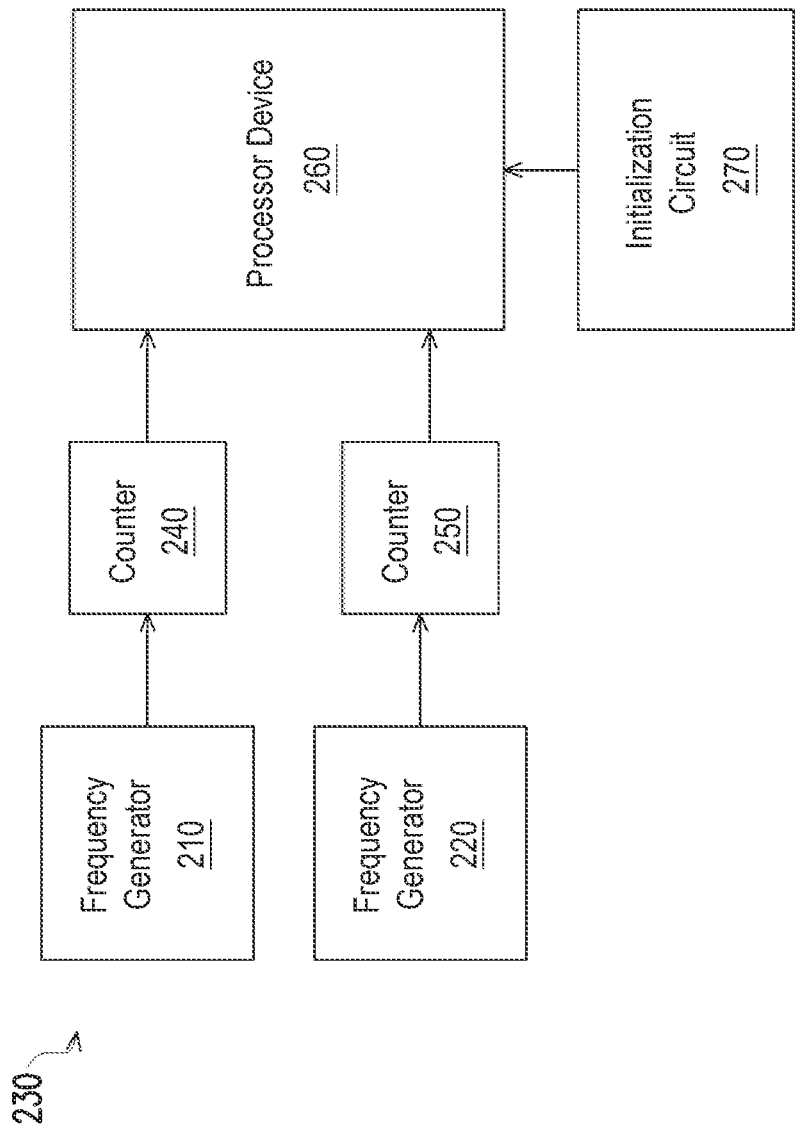
FIG. 2 is an illustration of a thin film transistor based temperature sensor circuit, according to some embodiments of the present disclosure.

FIG. 2 is an illustration of a thin film transistor based temperature sensor circuit 230 that can be implemented in temperature sensor device 130 of FIG. 1, according to some embodiments of the present disclosure. Thin film transistor based temperature sensor circuit 230 includes a thin film transistor based frequency generator 210, a complementary metal oxide semiconductor based frequency generator 220, counter devices 240 and 250, a processor device 260, and an initialization circuit 270.

Figure 3:
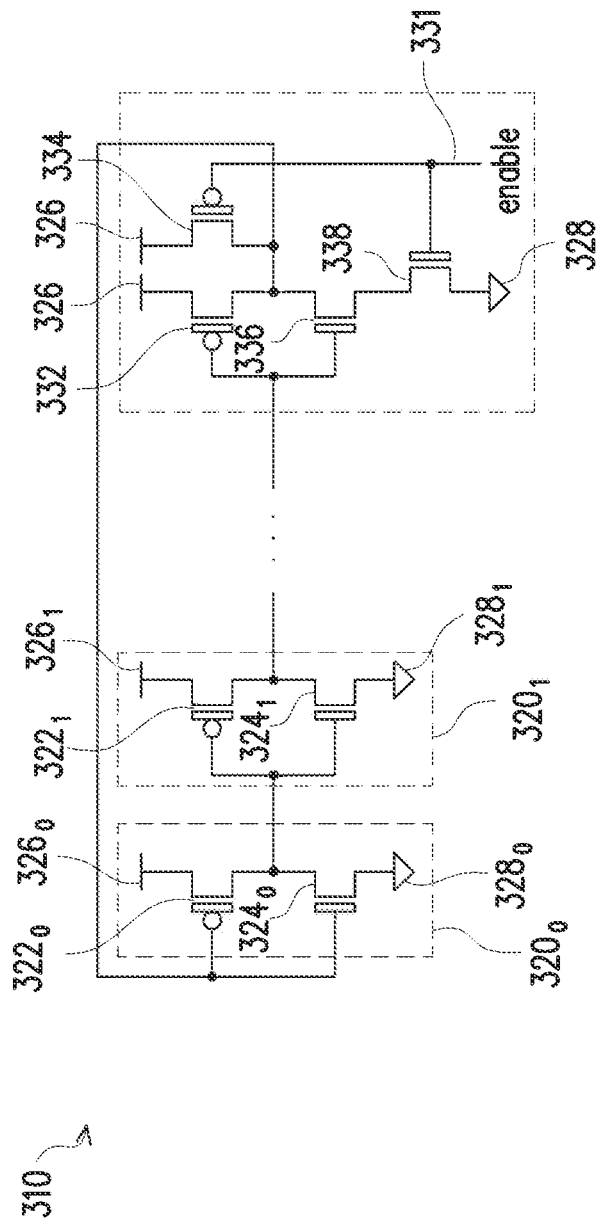
FIG. 3 is an illustration of a thin film transistor based ring oscillator circuit, according to some embodiments of the present disclosure.

In some embodiments of the present disclosure, thin film transistor based frequency generator 210 can be a ring oscillator circuit with thin film transistors, in which the ring oscillator circuit generates a pulse signal at a frequency. FIG. 3 is an illustration of a thin film transistor based ring oscillator circuit 310, according to some embodiments of the present disclosure. Thin film transistor based ring oscillator circuit 310 includes inverter circuits $320_0$ and $320_1$ and an enable circuit 330. Inverter circuits $320_0$ and $320_1$ are electrically coupled to one another in a ring oscillator arrangement, in which an input of inverter circuit $320_1$ is electrically coupled to an output of inverter circuit $320_0$. An output of inverter circuit $320_1$ can be electrically coupled to an input of another inverter circuit 320 (not shown) or to an input of enable circuit 330. An output of enable circuit 330 is electrically coupled to an input of inverter circuit $320_0$. Though two inverter circuits $320_0$ and $320_1$ are shown in FIG. 3, additional inverter circuits 320 can be electrically coupled to one another in a ring oscillator arrangement in the same manner as inverter circuits $320_0$ and $320_1$ to achieve a desired frequency and/or mitigate noise induced by a power supply voltage source 326 (e.g., 0.4 V, 0.6 V, 0.7 V, 1.0 V, 1.2 V, 1.8 V, 2.4 V, 3.3 V, and 5.0 V).

In some embodiments of the present disclosure, inverter circuit 320 includes a p-type thin film transistor 322 and an n-type thin film transistor 324 electrically coupled to one another in an inverter arrangement. A source/drain region of p-type thin film transistor 322 can be electrically coupled, via a source/drain terminal, to power supply voltage source 326. A source/drain region on n-type thin film transistor 324 can be electrically coupled, via a source/drain terminal, to a power supply voltage source 328 (e.g., ground or 0 V).

In some embodiments of the present disclosure, enable circuit 330 includes p-type thin film transistors 332 and 334 and n-type thin film transistors 336 and 338. P-type thin film transistors 332 and 334 are arranged in a parallel manner and include first source/drain regions electrically coupled to or shared with one another. Second source/drain regions of p-type thin film transistors 332 and 334 are electrically coupled, via source/drain terminals, to power supply voltage source 326. N-type thin film transistors 336 and 338 are arranged in a serial manner and include source/drain regions electrically coupled to or shared with one another. Another source/drain region of n-type thin film transistor 336 is electrically coupled to or shared with first source/drain regions of p-type thin film transistors 332 and 334. Another source/drain region of n-type thin film transistor 338 is electrically coupled to power supply voltage source 328. When an enable signal 331 is at a logic high value (e.g., voltage level of power supply voltage source 326), n-type thin film transistor 338 is turned "on" and p-type thin film transistor 334 is turned "off," thus activating thin film transistor based ring oscillator circuit 310. Conversely, when enable signal 331 is at a logic low value (e.g., voltage level of power supply voltage source 328), n-type thin film transistor 338 is turned "off" and p-type thin film transistor 334 is turned "on," thus de-activating thin film transistor based ring oscillator circuit 310.

In some embodiments of the present disclosure, p-type thin film transistor 322 in inverter circuit 320 and p-type thin film transistors 332 and 334 in enable circuit 330 each include a channel layer made of tin oxide, copper oxide, nickel oxide, or any other suitable material.

Figure 4:
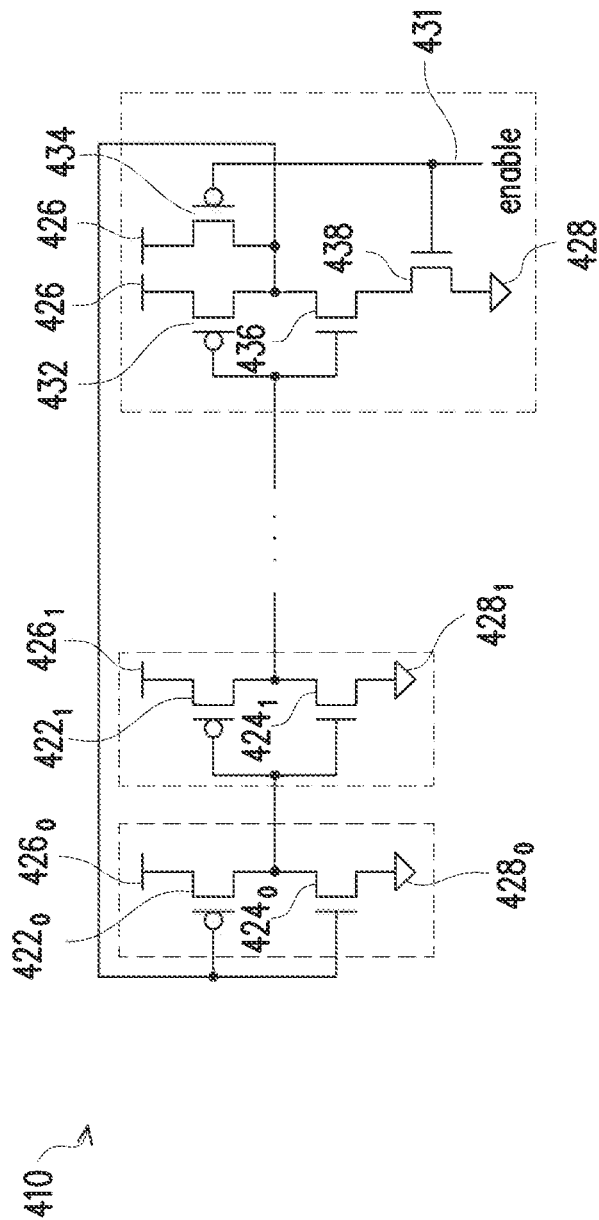
FIG. 4 is an illustration of a complementary metal oxide semiconductor transistor based ring oscillator circuit, according to some embodiments of the present disclosure.

Referring to FIG. 2, in some embodiments of the present disclosure, complementary metal oxide semiconductor based frequency generator 220 can be a ring oscillator circuit with complementary metal oxide semiconductor transistors, in which the ring oscillator circuit generates a pulse signal at a frequency. FIG. 4 is an illustration of a complementary metal oxide semiconductor based ring oscillator circuit 410, according to some embodiments of the present disclosure. Complementary metal oxide semiconductor based ring oscillator circuit 410 includes inverter circuits $420_0$ and $420_1$ and an enable circuit 430. Inverter circuits $420_0$ and $420_1$ are electrically coupled to one another in a ring oscillator arrangement, in which an input of inverter circuit $420_1$ is electrically coupled to an output of inverter circuit $420_0$. An output of inverter circuit $420_1$ can be electrically coupled to an input of another inverter circuit 420 (not shown) or to an input of enable circuit 430. An output of enable circuit 430 is electrically coupled to an input of inverter circuit $420_0$. Though two inverter circuits $420_0$ and $420_1$ are shown in FIG. 4, additional inverter circuits 420 can be electrically coupled to one another in a ring oscillator arrangement in the same manner as inverter circuits $420_0$ and $420_1$ to achieve a desired frequency and/or mitigate noise induced by a power supply voltage source 426 (e.g., 0.4 V, 0.6 V, 0.7 V, 1.0 V, 1.2 V, 1.8 V, 2.4 V, 3.3 V, and 5.0 V).

In some embodiments of the present disclosure, inverter circuit 420 includes a p-type complementary metal oxide semiconductor transistor 422 and an n-type complementary metal oxide semiconductor transistor 424 electrically coupled to one another in an inverter arrangement. A source/drain region of p-type complementary metal oxide semiconductor transistor 422 can be electrically coupled, via a source/drain terminal, to power supply voltage source 426. A source/drain region on n-type complementary metal oxide semiconductor transistor 424 can be electrically coupled, via a source/drain terminal, to a power supply voltage source 428 (e.g., ground or 0 V).

In some embodiments of the present disclosure, enable circuit 430 includes p-type complementary metal oxide semiconductor transistors 432 and 434 and n-type complementary metal oxide semiconductor transistors 436 and 438. P-type complementary metal oxide semiconductor transistors 432 and 434 are arranged in a parallel manner and include first source/drain regions electrically coupled to or shared with one another. Second source/drain regions of p-type complementary metal oxide semiconductor transistors 432 and 434 are electrically coupled, via source/drain terminals, to power supply voltage source 426. N-type complementary metal oxide semiconductor transistors 436 and 438 are arranged in a serial manner and include source/drain regions electrically coupled to or shared with one another. Another source/drain region of n-type complementary metal oxide semiconductor transistor 436 is electrically coupled to or shared with first source/drain regions of p-type complementary metal oxide semiconductor transistors 432 and 434. Another source/drain region of n-type complementary metal oxide semiconductor transistor 438 is electrically coupled to power supply voltage source 428. When an enable signal 431 is at a logic high value (e.g., voltage level of power supply voltage source 426), n-type complementary metal oxide semiconductor transistor 438 is turned "on" and p-type complementary metal oxide semiconductor transistor 434 is turned "off," thus activating complementary metal oxide semiconductor based ring oscillator circuit 410. Conversely, when enable signal 431 is at a logic low value (e.g., voltage level of power supply voltage source 428), n-type complementary metal oxide semiconductor transistor 438 is turned "off" and p-type complementary metal oxide semiconductor transistor 434 is turned "on," thus de-activating complementary metal oxide semiconductor based ring oscillator circuit 410.

Referring to FIG. 2, in some embodiments of the present disclosure, counter device 240 and counter device 250 are configured to count a number of pulses generated by thin film transistor based frequency generator 210 and complementary metal oxide semiconductor based frequency generator 220, respectively. The number of pulses can be counted based on a rising edge or a falling edge of the pulses crossing a predetermined voltage level (e.g., about half of power supply voltage source 328 and about half of power supply voltage source 428), according to some embodiments of the present disclosure.

In some embodiments of the present disclosure, processor device 260 is configured to determine a temperature (e.g., temperature of system 100 of FIG. 1) based on the number of pulses counted by counter devices 240 and 250 over a predetermined period of time. The temperature can be determined based on a count differential between counter device 240 and counter device 250 over the predetermined period of time—or a frequency difference between thin film transistor based frequency generator 210 and complementary metal oxide semiconductor based frequency generator 220, according to some embodiments of the present disclosure. As discussed above, thin film transistor based frequency generator 210 can be represented by thin film transistor based ring oscillator circuit 310 of FIG. 3. Further, complementary metal oxide semiconductor based frequency generator 220 can be represented by complementary metal oxide semiconductor based ring oscillator circuit 410 of FIG. 4.

Figure 5:
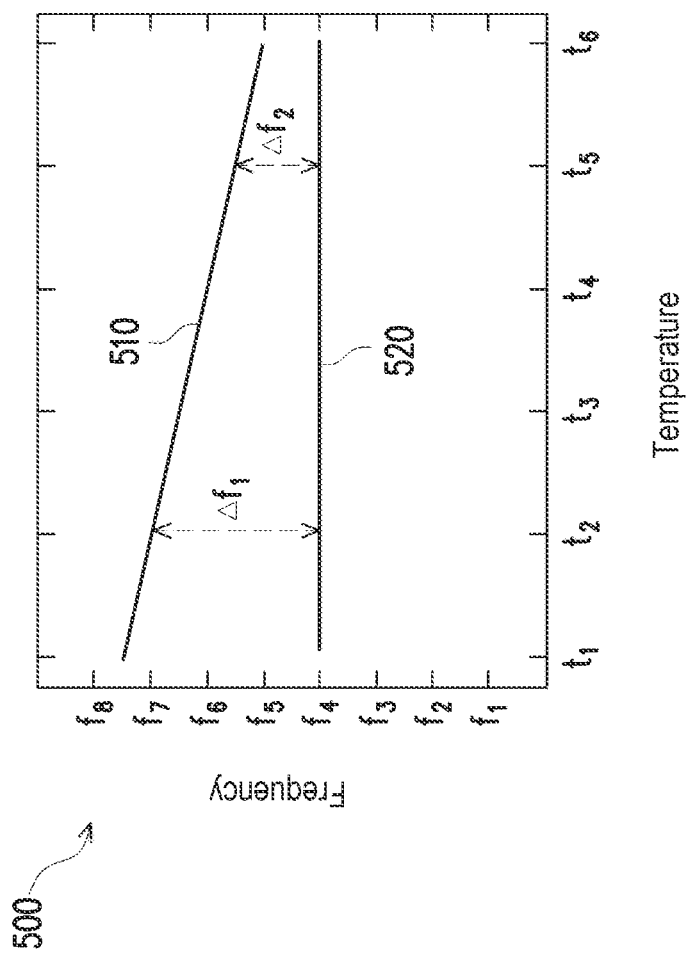
FIG. 5 is an illustration of an example graph showing a relationship between ring oscillator frequency and temperature for a complementary metal oxide semiconductor based ring oscillator circuit and a thin film transistor based ring oscillator circuit, according to some embodiments of the present disclosure.

FIG. 5 is an illustration of an example graph 500 showing a relationship between ring oscillator frequency and temperature for a complementary metal oxide semiconductor based ring oscillator circuit and a thin film transistor based ring oscillator circuit, according to some embodiments of the present disclosure. Example values for frequencies $f_1$, $f_2$, $f_3$, $f_4$, $f_5$, $f_6$, $f_7$, and fa are about 200 MHz, about 400 MHz, about 600 MHz, about 800 MHz, about 1000 MHz, about 1200 MHz, about 1400 MHz, and about 1600 MHz, respectively. Example values for temperatures $t_1$, $t_2$, $t_3$, $t_4$, $t_5$, and $t_6$ are about 20° C., about 40° C., about 60° C., about 80° C., about 100° C., and about 120° C., respectively.

Waveform 510 shows an example relationship between frequency and temperature for a complementary metal oxide semiconductor based ring oscillator circuit (e.g., complementary metal oxide semiconductor based ring oscillator circuit 410 of FIG. 4). As temperature increases (e.g., increase from temperature $t_1$ to temperature $t_6$—such as an increase from about 20° C. to about 120° C.), the frequency of the complementary metal oxide semiconductor based ring oscillator circuit decreases (e.g., decrease from (i) a frequency between frequency $f_7$ and frequency $f_8$ (such as about 1500 MHz) to (ii) about frequency $f_5$ (such as about 1000 MHz)), as shown in waveform 510. Waveform 520 shows an example relationship between frequency and temperature for a thin film transistor based ring oscillator circuit (e.g., thin film transistor based ring oscillator circuit 310 of FIG. 3). Across a temperature range $t_1$ to $t_6$ (e.g., about 20° C. to about 120° C.), the frequency of the thin film transistor based ring oscillator circuit remains substantially constant (e.g., frequency $f_4$—such as about 800 MHz), as shown in waveform 520.

Because the frequency of the thin film transistor based ring oscillator circuit is substantially constant across temperature, processor device 260 of FIG. 2 can determine a frequency difference between the thin film transistor based oscillator circuit (e.g., thin film transistor based ring oscillator circuit 310 of FIG. 3) and complementary metal oxide semiconductor based ring oscillator circuit (e.g., complementary metal oxide semiconductor based ring oscillator circuit 410 of FIG. 4). Based on the frequency difference, processor device 260 can further determine the temperature (e.g., temperature of system 100 of FIG. 1). For example and referring to FIG. 5, across the temperature range $t_1$ to $t_6$ and based on frequency differences Δf between waveforms 510 and 520, processor device 260 can determine temperatures within the temperature range $t_1$ to $t_6$ based on the frequency difference between the thin film transistor based ring oscillator circuit (waveform 520) and the complementary metal oxide semiconductor based ring oscillator circuit (waveform 510). In one example, based on a frequency difference $Δf_1$ (e.g., [frequency $f_7$]–[frequency $f_4$]=[about 1400 MHz]–[about 800 MHz]=about 600 MHz) between waveforms 510 and 520, processor device 260 can determine that the temperature is temperature $t_2$ (e.g., about 40° C.) because the frequency difference $Δf_1$ is mapped to temperature $t_1$. In another example, based on another frequency difference $Δf_2$ (e.g., [a frequency between $f_6$ and $f_5$]–[frequency $f_4$]=[about 1100 MHz]–[about 800 MHz]=about 300 MHz) between waveforms 510 and 520, processor device 260 can determine that the temperature is temperature $t_5$ (e.g., 100° C.) because frequency difference $\Delta f_2$ is mapped to temperature $t_5$.

Referring to FIG. 2, in some embodiments of the present disclosure, initialization circuit 270 is configured to provide processor device 260 with one or more parameters to determine the temperature based on the number of pulses counted by counter devices 240 and 250 over the predetermined period of time. For example, referring to FIG. 5, initialization circuit 270 can provide processor device 260 two or more temperature-frequency pairs for waveform 510, which shows an example relationship between frequency and temperature for a complementary metal oxide semiconductor based ring oscillator circuit (e.g., complementary metal oxide semiconductor based ring oscillator circuit 410 of FIG. 4). The temperature-frequency information for waveform 510 can include temperature-frequency pairs $t_2-f_7$ and $t_5-f_6$. Further, in some embodiments of the present disclosure, initialization circuit 270 can provide processor device 260 with temperature-frequency pair information for waveform 520, which shows an example relationship between frequency and temperature for a thin film transistor based ring oscillator circuit (e.g., thin film transistor based ring oscillator circuit 310 of FIG. 3). The temperature-frequency pair information for the complementary metal oxide semiconductor based ring oscillator circuit and the thin film transistor based ring oscillator circuit can be stored in non-volatile memory (e.g., Flash memory) in initialization circuit 270 for access by processor device 260, according to some embodiments of the present disclosure. Based on the temperature-frequency information, a linear relationship (e.g., $y=[m \cdot x]+b$, where m is slope, b is a y-axis intercept, x is an x-axis coordinate, and y is a y-axis coordinate) can be determined for waveforms 510 and 520 of FIG. 5 by processor device 260. In some embodiments of the present disclosure, the temperature-frequency information can be provided to initialization circuit 270 upon manufacturing and testing of system 100 of FIG. 1 and can be updated (if needed) at a later time to improve the accuracy of the temperature-frequency pair information.

Figure 6:
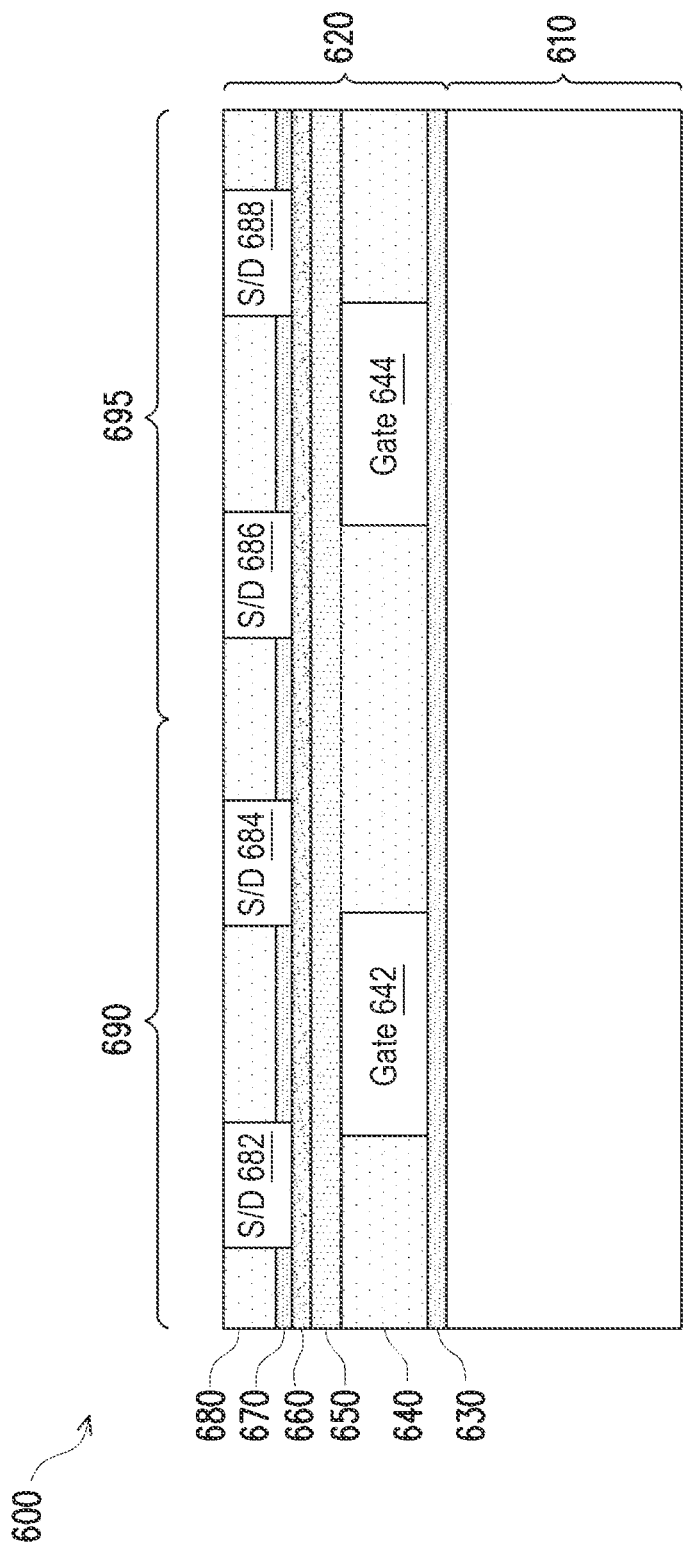
FIG. 6 is an illustration of an integrated circuit structure with a device layer and a thin film transistor device layer, according to some embodiments of the present disclosure.

FIG. 6 is an illustration of an integrated circuit structure 600 with a device layer 610 and a thin film transistor device layer 620, according to some embodiments of the present disclosure. Integrated circuit structure 600 can be implemented in system 100 of FIG. 1, such as in temperature sensor device 130. Integrated circuit structure 600 can include circuit structures, such as those in temperature sensor circuit 230 of FIG. 2—e.g., thin film transistor based frequency generator 210, complementary metal oxide semiconductor based frequency generator 220, counter devices 240 and 250, processor device 260, and initialization circuit 270. In some embodiments of the present disclosure, the thin film transistors in thin film transistor based frequency generator 210 can be formed in thin film transistor device layer 620 of FIG. 6 and the remaining circuit elements—e.g., complementary metal oxide semiconductor based frequency generator 220, counter devices 240 and 250, processor device 260, and initialization circuit 270—can be formed in device layer 610 of FIG. 6.

Device layer 610 can include a front end of line portion, a middle end of line portion, and a back front end of line portion—not shown in FIG. 6 for simplicity purposes. The front end of line portion can include structures fabricated on a substrate (e.g., active devices, passive devices, source/drain contact structures, gate contact structures, etc.) during a front end of line stage of integrated circuit fabrication. In some embodiments, the structures can include complementary metal oxide semiconductor based frequency generator 220, counter devices 240 and 250, processor device 260, and initialization circuit 270 of FIG. 2.

The middle end of line portion can include low-level interconnect structures (e.g., one or two layers of contacts and/or metal lines) fabricated on the front end of line portion during a middle end of line stage of integrated circuit fabrication. The low-level interconnect structures can electrically couple device terminals (e.g., source/drain contact structures, gate contact structures, etc.) to one another and/or to higher level interconnects in the back end of line portion. For example, referring to FIG. 2, the lower-interconnect structures can electrically couple (i) complementary metal oxide semiconductor based frequency generator 220 to counter device 250, (ii) counter device 250 to processor device 260, (iii) counter device 240 to processor device 260, and (iv) initialization circuit 270 to processor device 260.

The back end of line portion can include high-level interconnect structures (e.g., metal lines, vias, etc.) fabricated on the middle end of line portion during a back end of line stage of integrated circuit fabrication. For example, the high-level interconnect structures can electrically couple thin film transistors formed in thin film transistor device layer 620 to structures in the front end of line portion of device layer 610, such as counter device 240.

In some embodiments of the present disclosure, thin film transistors in thin film transistor based frequency generator 210 of FIG. 2 can be formed in thin film transistor device layer 620 of FIG. 6. Thin film transistor device layer 620 includes a first oxide layer 630, a second oxide layer 640, a gate oxide layer 650, a channel layer 660, a third oxide layer 670, and a fourth oxide layer 680, according to some embodiments of the present disclosure. Channel layer 660 can be made of tin oxide, copper oxide, nickel oxide, indium zinc oxide, indium tin oxide, indium oxide, gallium oxide, an indium-gallium-zinc oxide, zinc oxide, aluminum-zinc oxide, aluminum-doped zinc oxide, indium-tungsten oxide, or any other suitable material, according to some embodiments of the present disclosure.

For illustration purposes, two thin film transistors 690 and 695 are shown in thin film transistor device layer 620. Thin film transistors 690 and 695 can be a portion of the thin film transistors in thin film transistor based frequency generator 210 of FIG. 2, according to some embodiments of the present disclosure. Thin film transistor 690 can include a gate region 642, a first source/drain region 682, and a second source/drain region 684. Thin film transistor 695 can include a gate region 644, a first source/drain region 686, and a second source/drain region 688. In some embodiments of the present disclosure, gate regions 642 and 644 of thin film transistors 690 and 695, respectively, can be embedded in second oxide layer 640. First and second source/drain regions 682, 684, 686, and 688 can be embedded in third oxide layer 670 and fourth oxide layer 680. All of the thin film transistors in thin film transistor based frequency generator 210 can be formed in thin film transistor device layer 620 in a similar manner as thin film transistors 690 and 695, according to some embodiments of the present disclosure.

In some embodiments of the present disclosure, thin film transistor device layer 620 includes interconnect structures to electrically couple thin film transistors 690 and 695 (and the thin film transistors in thin film transistor based frequency generator 210) to one another, underlying structures (e.g., counter device 240 of FIG. 2), and/or interconnect structures in device layer 610. Further, in some embodiments of the present disclosure, additional interconnect structures can be disposed on thin film transistor device layer 620 (not shown in FIG. 6). The additional interconnect structures can electrically couple underlying devices and/or interconnect structures to one another. The additional interconnect structures can also electrically couple underlying devices and/or interconnect structures to circuit elements external to integrated circuit structure 600, such as to circuit elements in other integrated circuit structures.

Benefits of integrated circuit structure 600, among others, include a compact circuit design, low power consumption, and independence from temperature variations. With regard to compact circuit design, as described above with respect to FIG. 6, thin film transistor based frequency generator 210 of FIG. 2 can be fabricated over other structures (e.g., structures in device layer 610). In some embodiments of the present disclosure, the fabrication of thin film transistor based frequency generator 210 can be integrated (or compatible) with a complementary metal oxide semiconductor fabrication process. As a result, the die size footprint of thin film transistor based frequency generator 210 is minimal.

Figure 7:
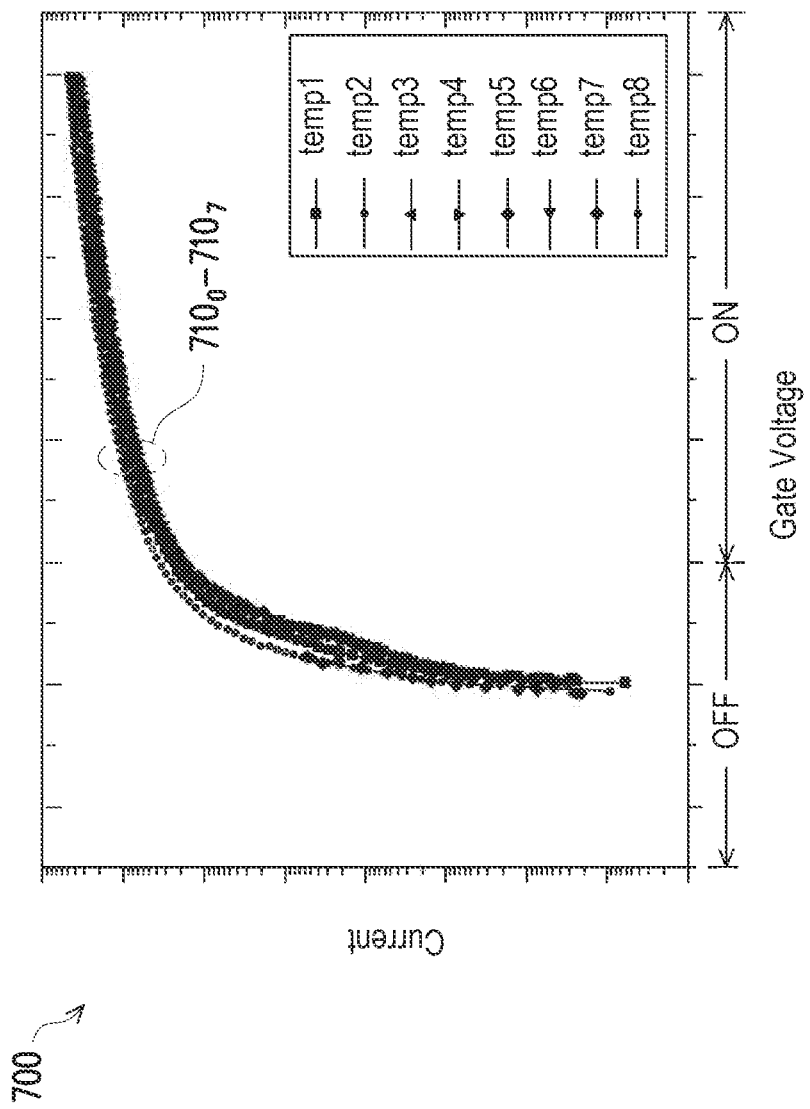
FIG. 7 is an illustration of an example graph showing a relationship between drain current of a thin film transistor and gate voltage of the thin film transistor for different temperatures, according to some embodiments of the present disclosure.

With regard to the low power consumption, in the "off" state, thin film transistor based frequency generator 210 generates very little current (e.g., about $1\times10^{-11}$ A and less), according to some embodiments of the present disclosure. FIG. 7 shows an example graph 700 illustrating a relationship between drain current of a thin film transistor and gate voltage of the thin film transistor for different temperatures, according to some embodiments of the present disclosure. In the "off" state of the thin film transistor (e.g., gate voltage of the thin film transistor is less than 0 V), the thin film transistor can generate very little current (e.g., between about $1\times10^{-7}$ A and about $1\times10^{-11}$ A). Thus, the power consumed by the thin film transistor (e.g., the thin film transistors in thin film transistor based frequency generator 210) is very low when the thin film transistor is in an "off" state.

With regard to independence from temperature variations, thin film transistor based frequency generator 210 generates substantially similar frequency across temperature because thin film transistor's electrical characteristics (e.g., current) are substantially similar across temperature. For example, referring graph 700 in FIG. 7, waveforms $710_0$-$710_7$ show a relationship between drain current of a thin film transistor and gate voltage of the thin film transistor for 8 different temperatures: temp1 (e.g., about 90 K); temp2 (e.g., about 130 K); temp3 (e.g., about 170 K); temp4 (e.g., about 210 K); temp5 (e.g., about 250 K); temp6 (e.g., about 290 K); temp7 (e.g., about 330 K); and temp8 (e.g., about 370 K). As shown in graph 700, waveforms $710_0$-$710_7$ are substantially similar, indicating that thin film transistors (e.g., the thin film transistors in thin film transistor based frequency generator 210) generate substantially the same current across temperature (assuming a constant gate voltage). In turn, a frequency generated by a thin film transistor based ring oscillator circuit (e.g., thin film transistor based ring oscillator circuit 310 of FIG. 3) is substantially the same across temperature for a given gate voltage.

Figure 8:
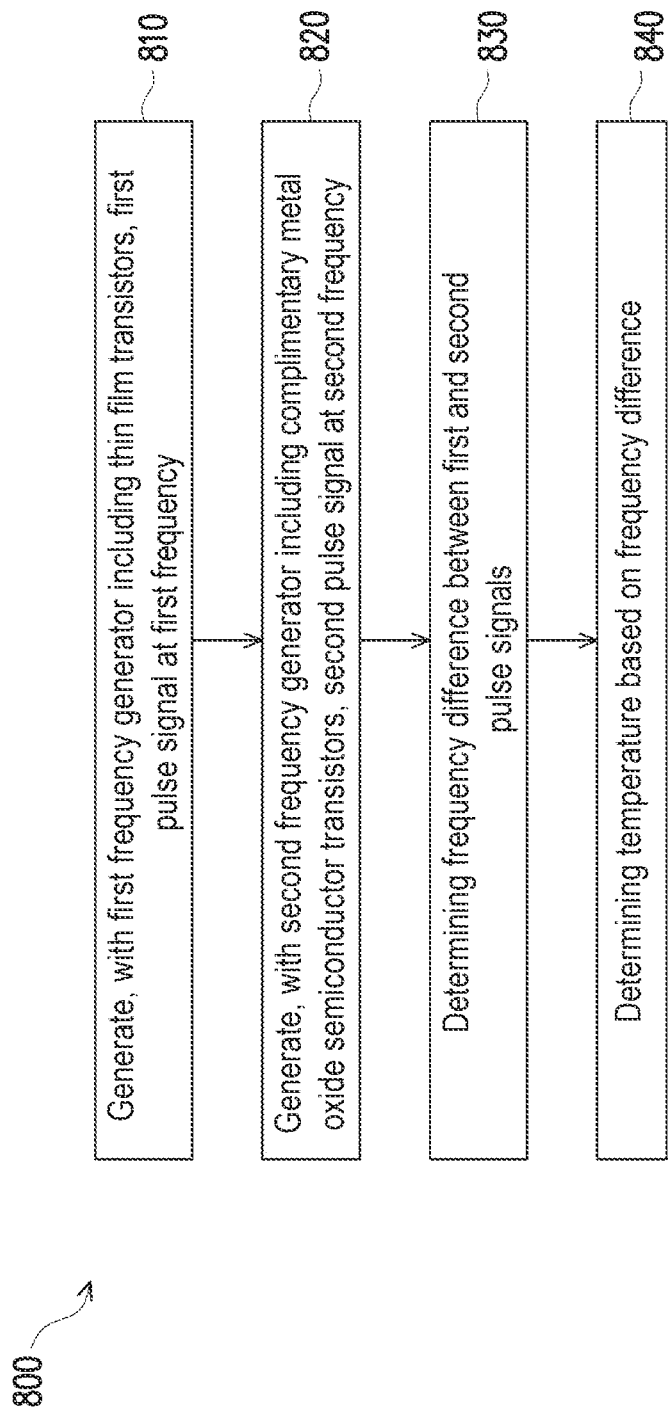
FIG. 8 is an illustration of a method for detecting temperature using a thin film transistor based temperature sensor circuit, according to some embodiments of the present disclosure.

FIG. 8 is an illustration of a method 800 for detecting temperature using a thin film transistor based temperature sensor circuit, according to some embodiments of the present disclosure. For example purposes, thin film transistor based temperature sensor circuit 230 of FIG. 2 is used to facilitate in the description of method 800.

In operation 810, a first pulse signal with a first frequency is generated by a first frequency generator with thin film transistors. For example, referring to FIG. 2, thin film transistor based frequency generator 210 can be the first generator that generates the first pulse signal at the first frequency. In some embodiments of the present disclosure, thin film transistor based frequency generator 210 can be a ring oscillator circuit, such as thin film transistor based ring oscillator circuit 310 of FIG. 3.

In operation 820 of FIG. 8, a second pulse signal with a second frequency is generated by a second frequency generator with complementary metal oxide semiconductor transistors. For example, referring to FIG. 2, complementary metal oxide semiconductor based frequency generator 220 can be the second generator that generates the second pulse signal at the second frequency. In some embodiments of the present disclosure, complementary metal oxide semiconductor based frequency generator 220 can be a ring oscillator circuit, such as complementary metal oxide semiconductor based ring oscillator circuit 410 of FIG. 4.

In operation 830 of FIG. 8, a frequency difference between the first and second pulse signals is determined with a processor device. For example, referring to FIG. 2, processor device 260 can determine the frequency difference between the first and second pulse signals. To determine the frequency difference, based on the number of pulses counted by counter devices 240 and 250, processor device 260 can calculate the first frequency associated with the first frequency generator (e.g., thin film transistor based frequency generator 210) and the second frequency associated with the second frequency generator (e.g., complementary metal oxide semiconductor based frequency generator 220). Further, processor device 260 can subtract the first frequency from the second frequency to determine the frequency difference.

In operation 840 of FIG. 8, the processor device determines a temperature based on the frequency difference. For example, as discussed above in reference to FIG. 5, across the temperature range $t_1$ to $t_6$ and based on frequency differences $\Delta f$ between waveforms 510 and 520, processor device 260 can determine temperatures within the temperature range based on the frequency difference between the thin film transistor based oscillator (waveform 520) and complementary metal oxide semiconductor based ring oscillator circuit (waveform 510). In one example, based on a frequency difference $\Delta f_1$ (e.g., [frequency $f_1$]–[frequency $f_4$]=[about 1400 MHz]–[about 800 MHz]=about 600 MHz) between waveforms 510 and 520, processor device 260 can determine that the temperature is temperature $t_2$ (e.g., about 40° C.) because the frequency difference $\Delta f_1$ is mapped to temperature $t_2$. In another example, based on another frequency difference $\Delta f_2$ (e.g., [a frequency between $f_6$ and $f_5$]–[frequency $f_4$]=[about 1100 MHz]–[about 800 MHz] =about 300 MHz) between waveforms 510 and 520, processor device 260 can determine that the temperature is temperature $t_5$ (e.g., 100° C.) because frequency difference $\Delta f_2$ is mapped to temperature $t_5$.

Processor device 260 can access temperature-frequency pair information for thin film transistor based ring oscillator circuit 310 and complementary metal oxide semiconductor based ring oscillator circuit 410 (e.g., the first frequency generator and the second frequency generator, respectively) from initialization circuit 270. The temperature-frequency pair information can be stored in non-volatile memory (e.g., Flash memory) in initialization circuit 270 for access by processor device 260, according to some embodiments of the present disclosure. Based on the temperature-frequency information, a linear relationship can be determined for waveforms 510 and 520 of FIG. 5 by processor device 260. In some embodiments of the present disclosure, the temperature-frequency information can be provided to initialization circuit 270 upon manufacturing and testing of system 100 of FIG. 1 and can be updated (if needed) at a later time to improve the accuracy of the temperature-frequency pair information. The updated temperature-frequency pair information can be stored in non-volatile memory in initialization circuit 270, according to some embodiments of the present disclosure.

Figure 9:
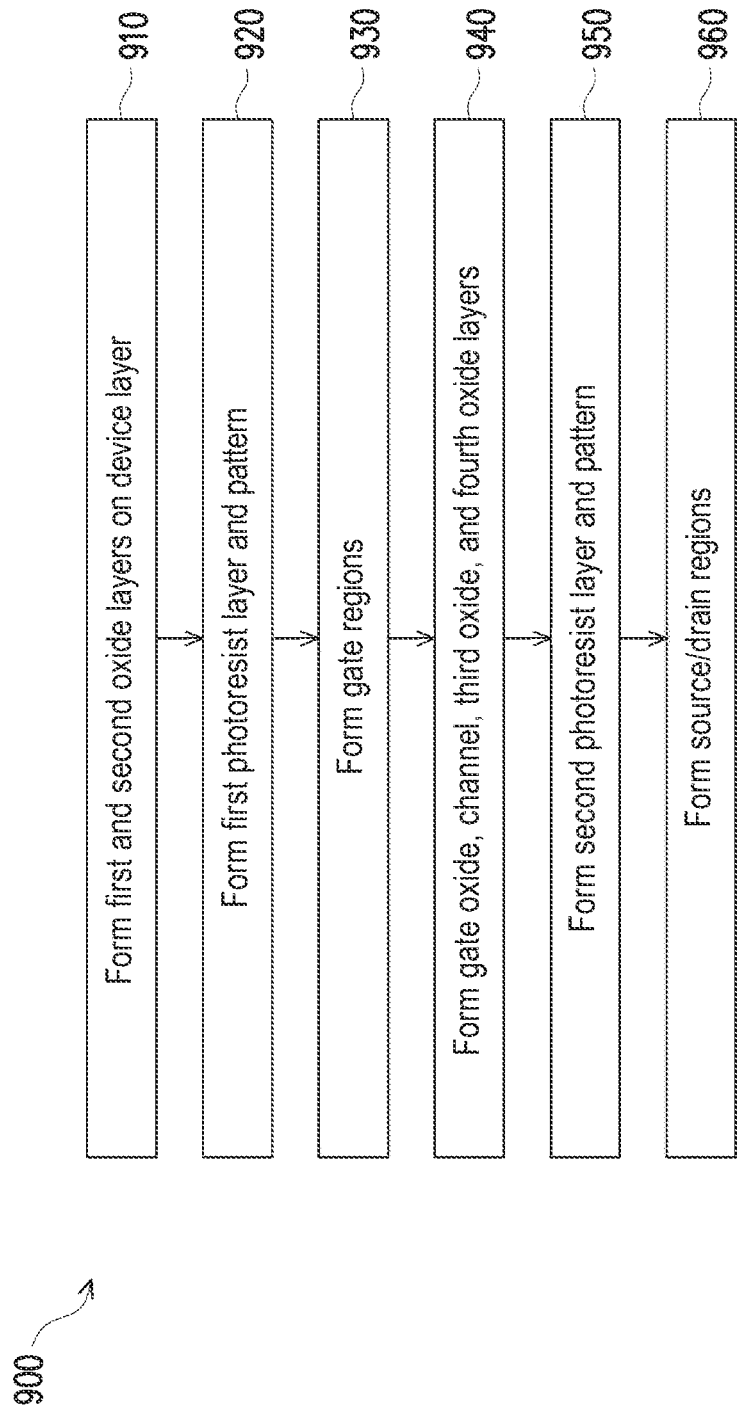
FIG. 9 is an illustration of a method for fabricating a thin film transistor device structure on a device layer, according to some embodiments of the present disclosure.

FIG. 9 is an illustration of a method 900 for fabricating a thin film transistor device structure on a device layer, according to some embodiments of the present disclosure. For illustration purposes, method 900 will be described with reference to FIGS. 6 and 10-14, which shows the thin film transistor device structure on the device layer at various stages of the thin film transistor device structure's fabrication process, according to some embodiments of the present disclosure. The operations of method 900 can be performed in a different order or some of the operations may not be performed depending on specific applications. It should be noted that method 900 may not produce a complete integrated circuit structure. Accordingly, it is understood that additional operations can be provided before, during, or after method 900, and that some other operations may only be briefly described herein. Elements in FIGS. 10-14 with the same annotations as the elements in the previous figures are described above.

Figure 10:
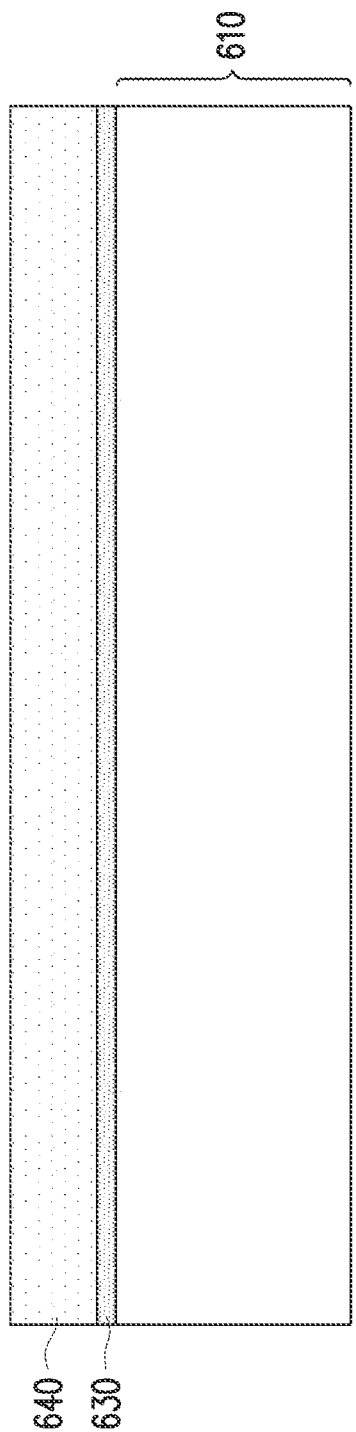
FIGS. 10-14 are illustrations of a thin film transistor device structure on a device layer at various stages of the thin film transistor device structure's fabrication process, according to some embodiments of the present disclosure.

In operation 910, a first oxide layer and a second oxide layer are formed on a device layer. Referring to FIG. 10, first oxide layer 630 and second oxide layer 640 are formed (e.g., deposited) on device layer 610.

Figure 11:
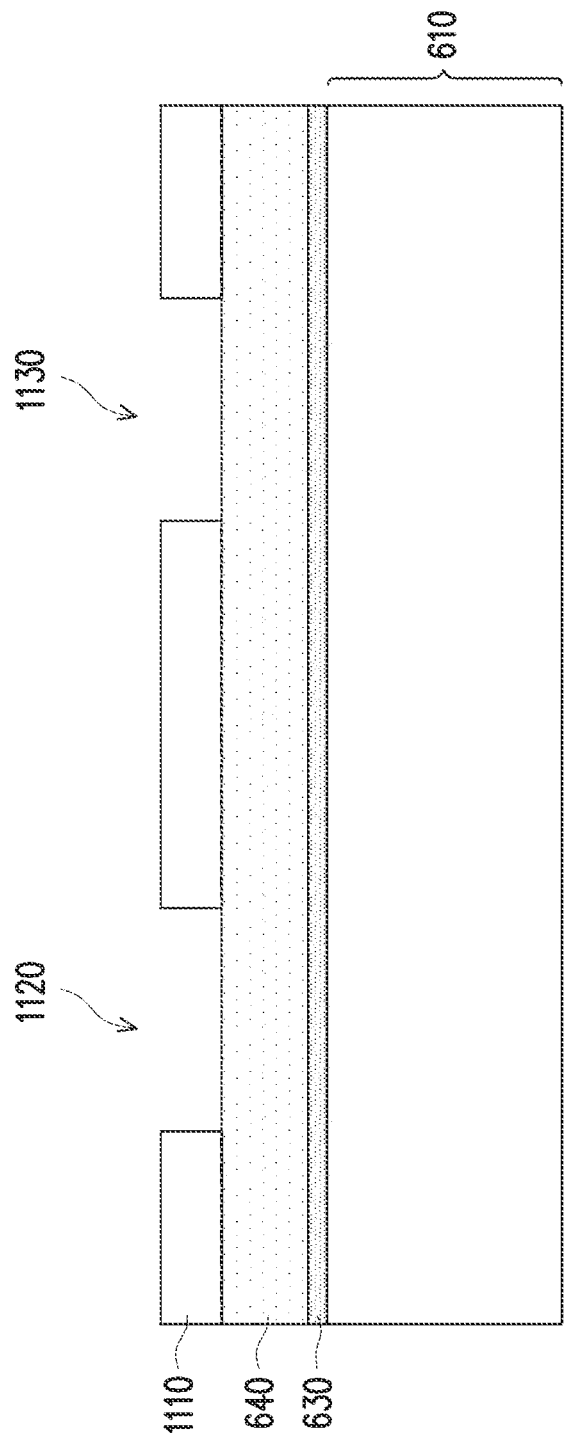

In operation 920, a first photoresist layer is formed on the second oxide layer and patterned to form openings. Referring to FIG. 11, a photoresist layer 1110 is formed on second oxide layer 640 and patterned to form openings 1120 and 1130.

Figure 12:
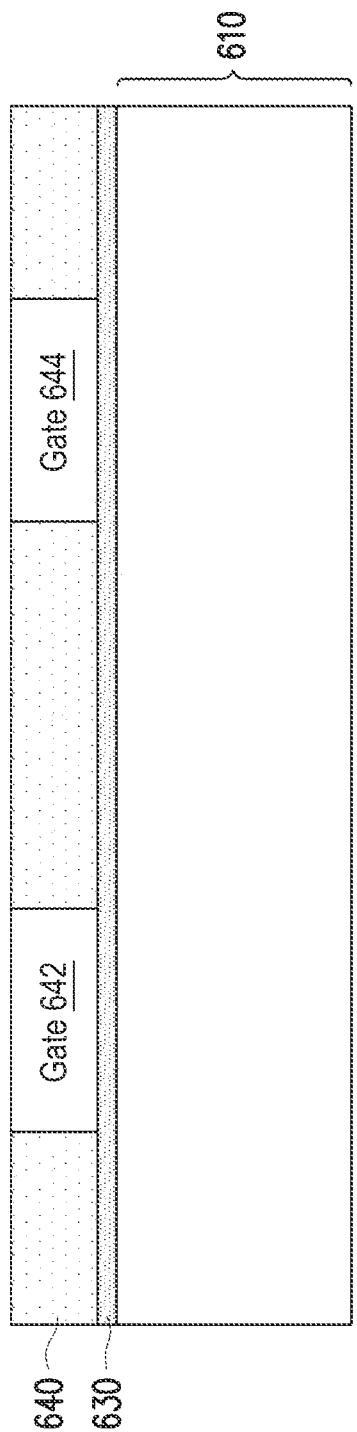

In operation 930, gate regions are formed. Referring to FIG. 12, after an etch process is performed in openings 1120 and 1130 and through second oxide layer 640, a gate material (e.g., a high-k dielectric material) is deposited. After photoresist layer 1110 and excess material are polished away (e.g., via a chemical mechanical polishing process), gate regions 642 and 644 are formed.

Figure 13:
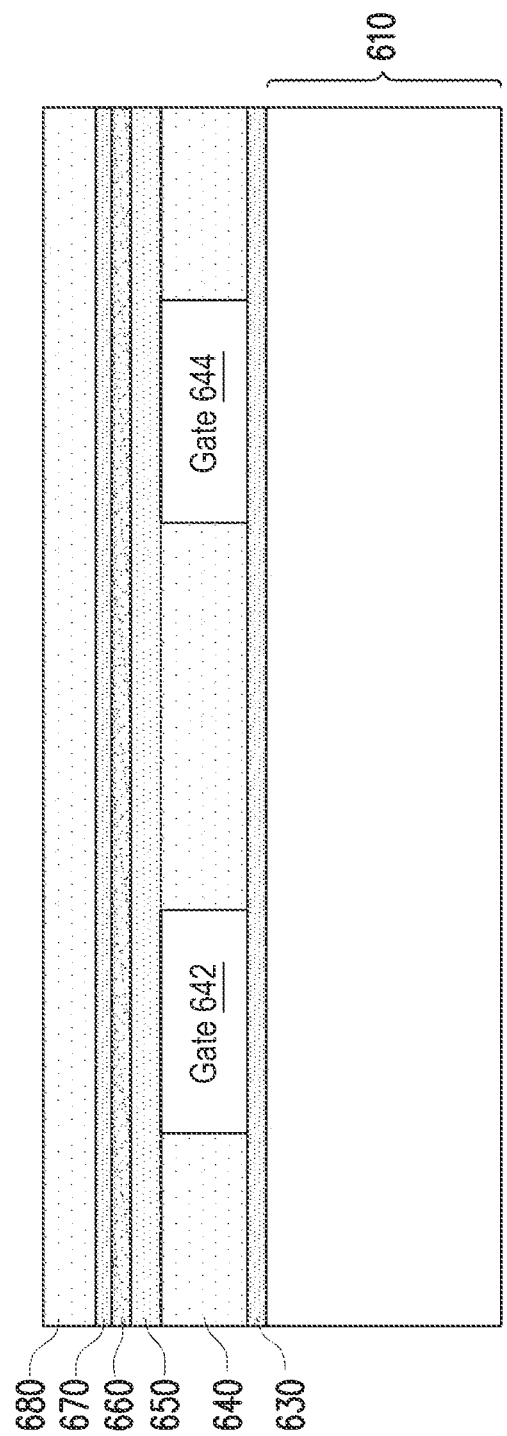

In operation 940, a gate oxide layer, a channel layer, a third oxide layer, and a fourth oxide layer are formed. Referring to FIG. 13, gate oxide layer 650, channel layer 660, third oxide layer 670, and fourth oxide layer 680 are formed (e.g., deposited) on the structure shown in FIG. 12.

Figure 14:
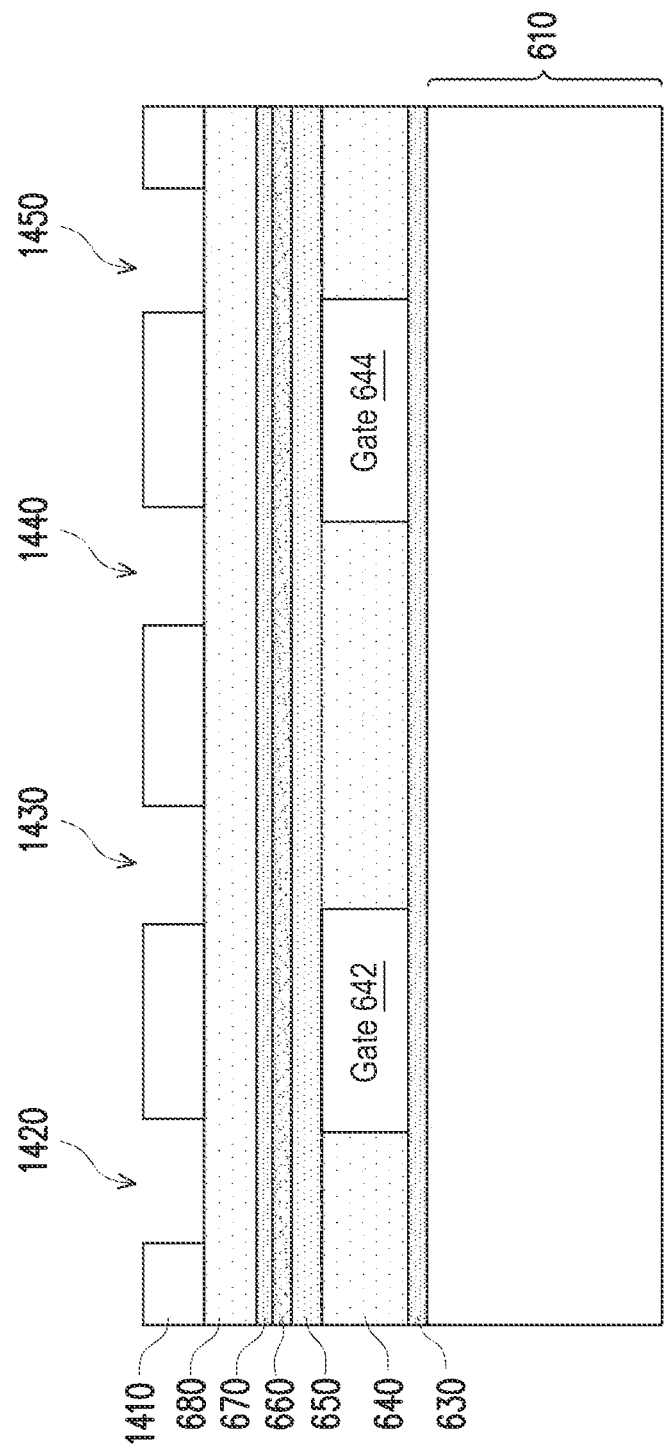

In operation 950, a second photoresist layer is formed on the fourth oxide layer and patterned to form openings. Referring to FIG. 14, a photoresist layer 1410 is formed on fourth oxide layer 680 and patterned to form openings 1420, 1430, 1440, and 1450.

In operation 960, source/drain regions are formed. Referring to FIGS. 6 and 14, after an etch process is performed in openings 1420, 1430, 1440, and 1450 and through third and fourth oxide layers 670 and 680, source/drain materials are deposited. After photoresist layer 1410 and excess material are polished away (e.g., via a chemical mechanical polishing process), source/drain regions 682, 684, 686, and 688 are formed.

Embodiments of the present disclosure describe a thin film transistor based temperature sensor device. The thin film transistor based temperature sensor device includes a first frequency generator with thin film transistors, a second frequency generator with complementary metal oxide semiconductor transistors, first and second counter devices, and a processor device. The first and second counter devices are configured to count a number of first pulses and a number of second pulses from the first and second frequency generators, respectively. The processor device is configured to determine a temperature, such as a temperature of a system implementing the thin film transistor based temperature sensor device, based on the number of first and second pulses. Benefits of the thin film transistor based temperature sensor device, among others, include low power consumption, a compact circuit design, and independence from temperature variation.

Embodiments of the present disclosure include a thin film transistor based temperature sensor circuit. The thin film transistor based temperature sensor circuit includes a first frequency generator with one or more thin film transistors, a second frequency generator with one or more complementary metal oxide semiconductor transistors, first and second counter devices, and a processor device. The first and second counter devices are configured to count a number of first pulses and a number of second pulses from the first and second frequency generators, respectively. The processor device is configured to determine a frequency based on the number of first and second pulses.

Embodiments of the present disclosure include an integrated circuit structure with a device layer and a thin film transistor device layer disposed on the device layer. The device layer includes a first ring oscillator circuit with complementary metal oxide semiconductor transistors, first and second counter devices, a processor device configured to determine a temperature based on pulses counted by the first and second counter devices, an initialization circuit configured to provide one or more parameters to the processor device, and a first interconnect structure. The thin film transistor device layer includes a second ring oscillator circuit with thin film transistors and a second interconnect structure arranged to electrically couple, via the first interconnect structure, the second ring oscillator circuit to the second counter device. The first and second counter devices are configured to count a number of first pulses and a number of second pulses from the first ring oscillator circuit and the second ring oscillator circuit, respectively. Further, the one or more parameters are associated with a relationship between frequency and temperature for the first and second ring oscillator circuits.

Embodiments of the present disclosure include a method for operation a thin film transistor based temperature sensor circuit. The method includes (i) generating, by a first frequency generator with thin film transistors, a first pulse signal at a first frequency, (ii) generating, by a second frequency generator with complementary metal oxide semiconductor transistors, a second pulse signal at a second frequency, (iii) determining, with a processor device, a frequency difference between the first and second pulse signals, and (iv) determining, with the processor device, a temperature based on the frequency difference.

It is to be appreciated that the Detailed Description section, and not the Abstract section, is intended to be used to interpret the claims. The Abstract section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first frequency generator comprising a plurality of thin film transistors arranged in a ring oscillator arrangement and configured to maintain a substantially constant frequency over a range of temperatures;
a second frequency generator comprising a plurality of complementary metal oxide semiconductor transistors arranged in the ring oscillator arrangement and configured to change in frequency over the range of temperatures;
first and second counter devices configured to count a number of first pulses and a number of second pulses from the first frequency generator and the second frequency generator, respectively; and
a processor device configured to determine a temperature based on a difference in the number of first and second pulses over the range of temperatures.

2. The circuit of claim 1, wherein the plurality of thin film transistors form a plurality of inverter circuits electrically coupled to one another in the ring oscillator arrangement.

3. The circuit of claim 2, wherein each of the plurality of inverter circuits comprises an n-type thin film transistor and a p-type thin film transistor coupled to one another.

4. The circuit of claim 3, wherein a source/drain terminal of the p-type thin film transistor is electrically coupled to a first power supply voltage source and a source/drain terminal of the n-type thin film transistor is electrically coupled to a second power supply voltage source.

5. The circuit of claim 1, wherein the plurality of complementary metal oxide semiconductor transistors form a plurality of inverter circuits electrically coupled to one another in the ring oscillator arrangement.

6. The circuit of claim 5, wherein each of the plurality of inverter circuits comprises an n-type complementary metal oxide semiconductor transistor and a p-type complementary metal oxide semiconductor transistor coupled to one another.

7. The circuit of claim 6, wherein a source/drain terminal of the p-type complementary metal oxide semiconductor transistor is electrically coupled to a first power supply voltage source and a source/drain terminal of the n-type complementary metal oxide semiconductor transistor is electrically coupled to a second power supply voltage source.

8. The circuit of claim 1, wherein the processor device is further configured to determine the difference in the number of first and second pulses over a predetermined period of time.

9. The circuit of claim 8, wherein the difference is mapped to the temperature in a relationship between frequency and temperature for the first and second frequency generators.

10. The circuit of claim 9, wherein the processor device is further configured to access information associated with the relationship between frequency and temperature for the first and second frequency generators.

11. An integrated circuit structure, comprising:
a device layer, comprising:
a first ring oscillator circuit comprising a plurality of complementary metal oxide semiconductor transistors arranged in a ring oscillator arrangement and configured to change in frequency over a range of temperatures;
first and second counter devices;
a processor device configured to determine a temperature based on pulses counted by the first and second counter devices;
an initialization circuit configured to provide one or more parameters to the processor device; and
a first interconnect structure; and
a thin film transistor device layer disposed on the device layer, wherein the thin film transistor device layer comprises:
a second ring oscillator circuit comprising a plurality of thin film transistors arranged in the ring oscillator arrangement and configured to maintain a substantially constant frequency over the range of temperatures; and
a second interconnect structure arranged to electrically couple, via the first interconnect structure, the second ring oscillator circuit to the second counter device,
wherein the first and second counter devices are configured to count a number of first pulses and a number of second pulses from the first ring oscillator circuit and the second ring oscillator circuit, respectively, and
wherein the one or more parameters are associated with a relationship between frequency and temperature for the first and second ring oscillator circuits.

12. The integrated circuit structure of claim 11, wherein the processor device is further configured to determine a difference based on the number of first and second pulses over a predetermined period of time.

13. The integrated circuit structure of claim 12, wherein the difference is mapped to the temperature in a relationship between frequency and temperature for the first and second ring oscillator circuits.

14. The integrated circuit structure of claim 11, wherein the initialization circuit comprises a non-volatile memory configured to store the one or more parameters.

15. The integrated circuit structure of claim 11, wherein the one or more parameters comprise temperature-frequency pair information for the first and second ring oscillator circuits.

16. A method, comprising:
generating, by a first frequency generator comprising thin film transistors arranged in a ring oscillator arrangement and configured to maintain a substantially constant frequency over a range of temperatures, a first pulse signal at a first frequency;
generating, by a second frequency generator comprising complementary metal oxide semiconductor transistors arranged in the ring oscillator arrangement and configured to change in frequency over the range of temperatures, a second pulse signal at a second frequency;
determining, with a processor device, a frequency difference between the first and second pulse signals; and
determining, with the processor device, a temperature based on the frequency difference over the range of temperatures.

17. The method of claim 16, wherein determining the frequency difference comprises:
counting a number of pulses in the first and second pulse signals over a predetermined period of time to calculate a first frequency associated with the first frequency generator and a second frequency associated with the second frequency generator; and subtracting the first frequency from the second frequency.

18. The method of claim 16, wherein determining the frequency difference comprises accessing temperature-frequency pair information for the first and second frequency generators to determine a relationship between frequency and temperature for the first and second frequency generators.

19. The method of claim 18, wherein accessing the temperature-frequency pair information comprises:

updating the temperature-frequency pair information; and storing the updated temperature-frequency pair information in memory to be accessed by the processor device.

20. The method of claim 16, wherein determining the temperature comprises mapping the frequency difference to the temperature based on a relationship between frequency and temperature for the first and second frequency generators.

* * * * *